United States Patent [19]

Mack

[11] 4,230,064
[45] Oct. 28, 1980

[54] UNIVERSAL T.V. CHANNEL KNOB

[76] Inventor: Bernard Mack, 1750 NE. 191st St., North Miami Beach, Fla. 33179

[21] Appl. No.: 99,987

[22] Filed: Dec. 3, 1979

Related U.S. Application Data

[63] Continuation-in-part of Ser. No. 21,359, Mar. 19, 1979, abandoned.

[51] Int. Cl.³ .......................... H03J 1/00; F16H 35/18
[52] U.S. Cl. ....................................... 116/245; 74/10 R; 74/10.1; 74/10.15; 116/DIG. 31
[58] Field of Search ............... 74/553 R, 10 R, 10.1, 74/10.15, 10.2, 10.22; 116/254, 245, 241, 258, DIG. 21, DIG. 29, DIG. 31; 16/121

[56] References Cited

U.S. PATENT DOCUMENTS

| | | | |
|---|---|---|---|
| 291,687 | 1/1884 | Clark | 292/347 |
| 1,310,329 | 7/1919 | Edridge et al. | 116/254 |
| 2,536,445 | 1/1951 | Hoffman | 16/121 X |
| 2,568,630 | 9/1951 | Hoellerich | 116/245 |
| 3,750,619 | 8/1973 | Yamamura | 74/553 X |
| 3,769,933 | 11/1973 | Fox | 74/553 |
| 3,902,375 | 9/1975 | Herrick | 74/553 |
| 3,972,241 | 8/1976 | Valdettaro | 116/DIG. 31 |
| 4,037,490 | 7/1977 | Wilson | 74/553 |
| 4,062,315 | 12/1977 | Sickmen | 116/254 |

FOREIGN PATENT DOCUMENTS 1102487 10/1955 France ........................... 116/245

*Primary Examiner*—Leslie Braun
*Attorney, Agent, or Firm*—Ernest N. Schmidt

[57] ABSTRACT

A universal T.V. channel knob has a channel indicator skirt slidably receivable on a cylindrical, molded synthetic plastic knob shaft and relatively attachable thereto in an infinite number of rotative positions to provide for universal replacement usage. A metal, radially depressable slide pin is provided for securing the dial skirt in adjusted rotative position with respect to the knob shank with only minimal projection inwardly along its mounting shank, thereby minimizing any possibility of interference with fine tuner knob assemblies and the like that may be coaxially arranged in close proximity behind the T.V. channel knob assembly.

7 Claims, 6 Drawing Figures

UNIVERSAL T.V. CHANNEL KNOB

This is a continuation-in-part of my patent application Ser. No. 21,359, filed Mar. 19, 1979, now abandoned, entitled Universal T.V. Channel Knob.

Many electric appliances, radios, T.V. sets and other equipment have control knobs comprising a manual grasping knob for adjustment and a disc-like skirt portion attached thereto and having marginal markings or indicia serving to indicate the rotative setting position or indexing of a controlled shaft. The increased diameter size of the skirt portions of such control knobs serves to cover the housing opening through which the control shaft of the component to be controlled or adjusted projects. Many of such knobs, and particularly T.V. channel selector knobs, differ from one model to another or from one manufacturer to another principally in that the channel or tuning indicator markings along the marginal edge of the control knob skirt are not in uniform registry with the angular position of attachment of the tuning knob assembly to the shaft of the channel selector or tuner to be controlled. For this reason so-called universal T.V. receiver tuning knobs have heretofore been devised, wherein a separately provided disc-like skirt can be rotatively positioned at any one of a plurality of discrete positions on the control knob shank in an attempt to accommodate to the various positions of channel selection marking for a given rotative position of the shaft to be controlled. An example of such a "universal" tuning knob is disclosed in U.S. Pat. No. 4,062,315 to Sickman, wherein thirteen angular positions of the channel indicator skirt may be selected with respect to the mounting position of the cylindrical knob shank on the tuner shaft to be controlled. Such universal T.V. tuning knobs as have heretofore been devised, however, are not truly universal in that in many instances rotative displacement of the skirt is not necessarily in incremental steps, such as thirteen steps, one for each channel, but may also be anywhere in between. UHF T.V. tuners moreover, are continuously adjustable, rather than stepwisely adjustable as for T.V. channel 2 through 13 selection as described above, requiring that replacement UHF knob assemblies also be continuously adjustable. Thus, precise indexing or channel selection indication cannot always be achieved with universal T.V. channel replacement knobs heretofore devised.

It is, accordingly, the principal object of this invention to provide a novel and improved universal T.V. channel knob of the character described wherein the knob skirt is rotatively, as well as longitudinally, adjustable with respect to the channel selector knob assembly at any rotative or longitudinal position, thereby achieving a truly universal positional adjustment replacement.

A more particular object is to provide a replacement knob of the character described which is particularly well suited to use with channel selector knobs of the type wherein at least the shaft portion is formed of a synthetic plastic material, and wherein the knob skirt has a radially depressable locking pin adapted to be embedded into the knob portion at an adjusted position thereabout and therealong for securing the parts together.

Another object of the invention is to provide a universal replacement knob of the chacter described wherein the mechanism for attachment between the knob shank and skirt portions is of such compact construction as results in only minimal projection beyond the inner face of the skirt portion, thereby minimizing any possibility of interference with coaxial adjustment knobs or the like which may be independently rotatable behind the knob assembly being replaced.

Yet another object of the invention is to provide a universal T.V. channel replacement knob which can readily be assembled for any particular replacement with use of simple hand tools such as pliers or the like and which, once so assembled, will be dependably secure in their assembly.

Still another object of my invention is to provide a two-part replacement knob of the character described which will be simple in construction, easy to manufacture in quantity production, economical in cost, attractive in appearance and durable in use.

Other objects, features and advantages of the invention will be apparent from the following description when read with reference to the accompanying drawings. In the drawings, wherein like reference numerals denote corresponding parts throughout the several views.

Figure 3:
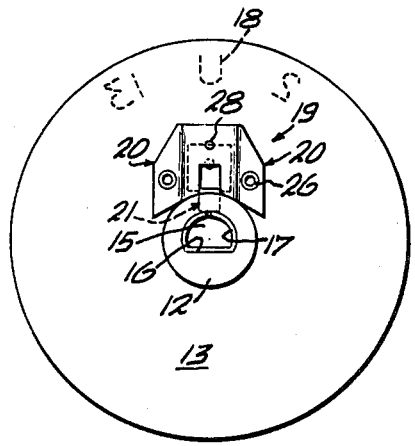
FIG. 3 is a rear elevational view of the T.V. knob assembly illustrated in FIG. 2.

Referring now in detail to the drawings, reference numeral 10 designates, generally, a preferred form of universal T.V. channel knob embodying my invention, the same comprising a knob bar 11 integrally molded with a cylindrical shank or shaft 12, and a separate knob skirt 13 having a central opening 14 by means of which it is slidably receivable on said shank to be secured thereto in the required position of rotative adjustment by means and in the manner hereinafter more particularly described. The cylindrical shank or shaft 12 is formed with an axially-extending control shaft pocket 15, D-shaped in cross-section, the flat 16 of which, as illustrated in FIG. 3, will preferably be in horizontal registration with the letter U, indicated by reference numeral 18, which is impressed or otherwise provided on the face of knob dial 13 and which serves to indicate channel selection. For added strength upon slide-on coupling with a controlled shaft, an outer end portion of the control shaft pocket 16 is lined with a frictionally-retained, sheet-spring metal liner 17, also D-shaped in cross-sectional shape.

As illustrated by way of example in FIG. 3, the knob dial skirt 13 is also provided in the conventional manner and about its outer marginal face portion with channel selection numbers 2 through 13 (only channel numbers 2 and 13 are illustrated). It is to be understood that the numbers 2 through 13 are representative of the twelve commercial T.V. broadcast channels for selection with use of the T.V. channel knob embodying my invention, and that the letter U represents the channel knob setting for UHF reception with the aid of the usual UHF tuning dial, as is hereinafter more particularly described. It is also to be understood that this invention can be applied as well to UHF dials, wherein the channels are conventionally numbered 14 through 84.

Figure 4:
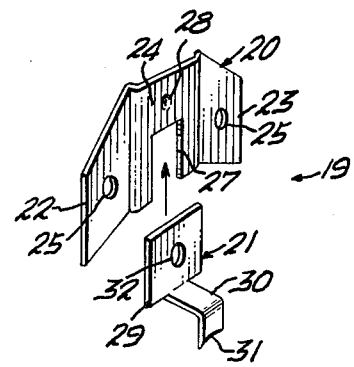
FIG. 4 is an oblique view separately illustrating the depressable sheet metal locking part prior to its attachment to the knob skirt.

As means for securing the knob dial skirt 13 in rotative adjusted position upon shank or shaft 12 and against knob bar 11, said dial skirt has secured thereto, against its inner or back face, a locking pin assembly 19. As separately illustrated in FIG. 4, the locking pin assembly 19 comprises a retainer plate 20 and a slide pin member 21. The retainer plate 20, which can be fabricated either of sheet metal or of a synthetic plastic material, is symmetrical about its vertical axis, as illustrated, and comprises a pair of opposed side-wing portions 22, 23 lying in a common plane and separated by an integrally-formed, central, laterally off-set portion 24. Each side-wing portion 22, 23 may be provided with a through opening 25 for the reception of rivets 26 riveting the retainer plate 20 against the back face of knob skirt 13, as best illustrated in FIG. 3. Alternatively, the rivet openings can be omitted and the retainer plate secured in place by use of a suitable adhesive or cement. The central portion 24 of retainer plate 20 is provided with a rectangular recess 27, open at the bottom as best illustrated in FIG. 4. The remaining upper portion of central portion 24 is provided with a small, round, inwardly-projecting dimple 28, for the purpose hereinafter appearing.

The slide pin member 21, preferably of sheet steel, comprises a rectangular body portion 29, the lower edge of which is integrally formed with a central, outwardly and downwardly-bent pin portion 30 of substantially reduced width. The tip end of the downwardly-bent pin portion 30 is ground at an angle, as indicated at 31, to provide a sharp cutting edge. The rectangular body portion 29 is provided with a central opening 32 for the purpose hereinafter described. After being formed, the slide pin member 21 will be hardened, such as by heat treatment, so that it will retain its shape while being embeddingly depressed for locking engagement within the cylindrical shank 12, as is hereinafter described.

Figures 1, 2:
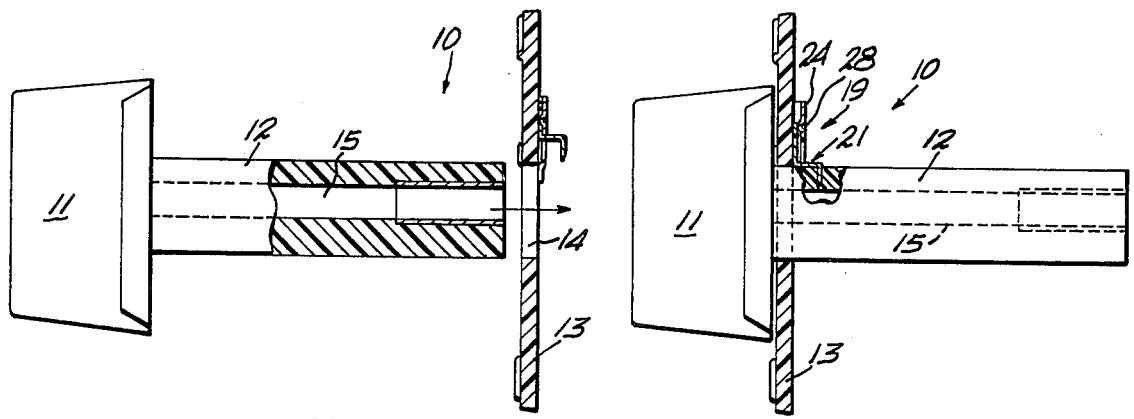
FIG. 1 illustrates, in side elevation and partly in cross-section, one form of universal T.V. channel knob embodying the invention, in "exploded" view prior to assembly for particular replacement installation.
FIG. 2 is a view similar to FIG. 1 but illustrating the circular skirt attached to the knob shank in proper rotative position for the installation to be made.
Figure 5:
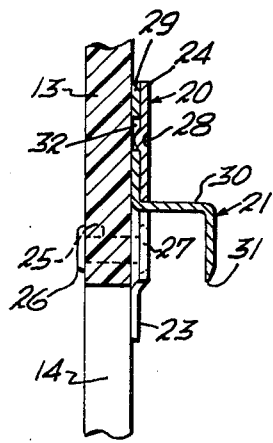
FIG. 5 is a fragmentary view, on an enlarged scale and in cross-section, illustrating the withdrawn position of the locking pin prior to assembly to the knob shank.

As best illustrated in FIGS. 1 and 5 (see also FIG. 3), upon attachment of the locking pin assembly 19 to the back face of the dial skirt 13, the slide pin member body portion 29 will be placed up within the rectangular recess defined by the central, laterally off-set portion 24 of the retainer plate 20, with the outwardly and downwardly-bent portion 30 thereof projecting through retainer plate recess 27, after which the rivets 26 (or cement) will be used to secure the retainer plate in place. As illustrated in FIGS. 1 and 5, the thickness of the rectangular body portion 29 of slide pin member 21 is approximately the same as the off-set depth of laterally off-set portion 24 of retainer plate 20, so that the inwardly-projecting dimple 28 received within the slide member opening 32 normally retains said slide member in its upper or withdrawn position. The locking pin assembly 19 is so positionally secured to the inside knob dial skirt 13 that the tip end 31 of the outwardly and downwardly-bent portion 30 is slightly spaced from the projected cylindrical opening defined by central skirt opening 14 so that, as illustrated in FIG. 1, when the cylindrical shank or shaft 12 is fitted through said opening for positional adjustment with respect thereto, there will be no interference.

Figure 6:
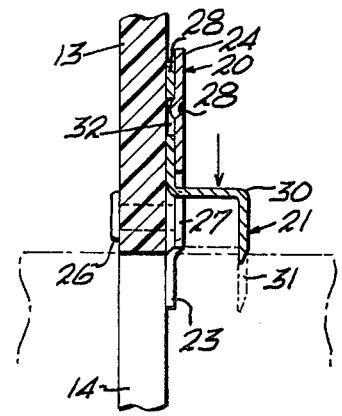
FIG. 6 is a view similar to that of FIG. 5 but illustrating how the locking pin is piercingly pressed to the relatively soft plastic knob shank to secure the knob skirt in adjusted position.

In use, after having located the knob dial skirt 13 on its knob bar shank or shaft 12 in proper position for replacement of an inoperable T.V. channel knob, a pair of pliers can be used to clamp down upon the laterally-extending or outwardly-bent pin portion, as illustrated by the arrow in FIG. 6, causing the sharp edged, radially-extending tip end portion to become embedded in the synthetic plastic material of the shaft to interlock the parts (see FIGS. 2, 3 and 6). It is to be understood that in the attachment process, the laterally off-set portion 24 of the retainer plate 20 will deform slightly to permit downward passage of the slide pin member body portion 29 over the inwardly-projecting dimple 28.

With reference particularly to FIG. 6, a salient feature of the invention, in addition to its simplicity and ease of application, resides in its compact mechanism, particularly when installed, whereby a minimum of obstructed bulk is added at the interconnecting site, thereby minimizing any possibility of interference with coaxial adjustment knobs or the like which may be independently rotatable behind the knob assembly being replaced.

While there is illustrated and described herein only one form in which the invention can conveniently be embodied in practice, it is to be understood that this form is presented by way of example only and not in a limiting sense. The invention, in brief, comprises all the embodiments and modifications coming within the scope and spirit of the following claims.

What I claim as new and desire to secure by Letters Patent is:

1. A control knob assembly for universal replacement of T.V. channel knobs and the like comprising, in combination, a knob bar portion for manual grasping, a cylindrical knob shank portion extending perpendicularly outwardly with respect thereto, said cylindrical knob shank portion being formed of a synthetic plastic material, a coaxial pocket in the outer end of said knob shank portion, said pocket being of "D-shaped" cross-sectional configuration for sliding fit intercoupling with a control shaft of complementary cross-sectional configuration, a circular, disc-shaped, substantially flat skirt member having a central circular opening of such size as to provide for close sliding fit of said skirt member over said knob shank portion, said skirt member being provided, along marginal outer edge portions of one side thereof adjacent the outer periphery, with indicia serving to indicate the rotative setting position of a controlled shaft, and means carried by said skirt member and piercingly receivable within said knob shank portion for fixedly securing said skirt member thereto at any one, selectively, of an infinite number of relatively rotative positions as well as a wide range of relatively longitudinal positions, said skirt member securing means comprising a metal pin member having a pin head portion at one end and a pin point at one other end, means carried by the other side of said skirt member for supporting said pin member and constraining it to radial movement with respect to the axis of generation of said circular skirt member, said pin member being radially axially movable with respect to said skirt member between a first position whereat said pin point is withdrawn from said skirt member central opening, and a second position whereat said point portion projects within said central opening, and means frictionally retaining said pin member in said first position whereby, upon said skirt member being selectively, positionally received on said knob shank portion, said pin member can be radially depressed so that said point portion thereof will be imbedded into said knob shank portion for fixedly securing said skirt member thereto, at the selected position.

2. A control knob assembly as defined in claim 1 wherein said pin head supporting means comprises a retainer plate fixed with respect to said other side of said skirt member and defining therewith a radially-extending recess of substantially rectangular cross-sectional shape, said pin member comprising a rectangular body portion slidably received within said recess, said pin member being integrally formed with an outwardly bent portion from the outer end of which said pin point extends.

3. A control knob assembly as defined in claim 2 wherein said pin member frictionally retaining means comprises a through opening in said rectangular body portion and an inwardly-directed dimple formed in said retainer plate and received in said through opening when said pin member is in said first position.

4. A control knob assembly as defined in claim 3 wherein said retainer member is formed of sheet metal and comprises a pair of opposed side wing portions lying in a common plane, said side wing portions being separated by an integrally-formed, central, laterally-outset portion defining, with said skirt member, said rectangular opening.

5. A control knob assembly as defined in claim 4 wherein said pin member is formed of sheet metal, said pin member being of reduced width with respect to said rectangular body portion thereof, said pin point being cut at an angle.

6. A control knob assembly as defined in claim 5 wherein said knob bar and cylindrical knob shank portion are integrally molded of synthetic plastic material.

7. A control knob assembly as defined in claim 6 wherein said retainer side wing portions are fixed to said skirt member by rivets.

* * * * *